United States Patent [19]

Geissler

[11] Patent Number: 4,503,485
[45] Date of Patent: Mar. 5, 1985

[54] ARRANGEMENT FOR CARRYING ELECTRICAL AND/OR ELECTRONIC COMPONENTS

[75] Inventor: Klaus H. Geissler, Backnang, Fed. Rep. of Germany

[73] Assignee: Licentia Patent-Verwaltungs-GmbH, Frankfurt am Main, Fed. Rep. of Germany

[21] Appl. No.: 573,583

[22] Filed: Jan. 24, 1984

Related U.S. Application Data

[63] Continuation of Ser. No. 312,153, Oct. 16, 1981, abandoned.

[30] Foreign Application Priority Data

Oct. 18, 1980 [DE] Fed. Rep. of Germany ....... 3039440

[51] Int. Cl.³ ........................ H05K 7/20; H05K 9/00
[52] U.S. Cl. ..................... 361/424; 361/386; 361/387; 361/419; 174/35 R
[58] Field of Search ............. 174/68.5, 16 HS, 35 R, 174/52 R; 357/76, 81, 84; 363/141, 144; 361/386, 387, 424, 388, 389, 400, 414, 417, 419

[56] References Cited

U.S. PATENT DOCUMENTS

| | | | |
|---|---|---|---|
| 3,611,046 | 10/1971 | Covert | 361/387 |
| 3,626,252 | 12/1971 | Cath | 361/387 |
| 3,659,340 | 5/1972 | Giedd | 361/419 |
| 3,908,188 | 9/1975 | Kawamoto | 174/16 HS |
| 3,909,699 | 9/1975 | Elder | 357/76 |
| 3,930,114 | 12/1975 | Hodge | 174/16 HS |
| 4,204,247 | 5/1980 | Wigley . | |

FOREIGN PATENT DOCUMENTS 1861572 8/1962 Fed. Rep. of Germany .

Primary Examiner—G. P. Tolin
Attorney, Agent, or Firm—Spencer & Frank

[57] ABSTRACT

An arrangement for mounting circuit components which operate at high power densities at high potential levels, which arrangement includes means defining a major and a minor insulating layer on the latter of which the components are mounted, the arrangement including a metal shield embedded between major and minor insulating layer and formed to partly surround the components, and a connection for applying to the metal shield a potential selected to minimize the potential between the components and the shield, wherein the shield and the minor layer are formed for enabling the shield to receive power dissipated by the components at high heat flux density and for heat received by the shield to be removed through the major layer with low heat flux density.

4 Claims, 3 Drawing Figures

ARRANGEMENT FOR CARRYING ELECTRICAL AND/OR ELECTRONIC COMPONENTS

This application is a continuation of application Ser. No. 312,153, filed Oct. 16, 1981, now abandoned.

BACKGROUND OF THE INVENTION

The present invention relates to an arrangement for mounting electrical and/or electronic components, particularly, components with significant power dissipation which operate at high superimposed potential in applications where high packaging density is required as in mobile installations.

Often it is necessary to cool individual components or complete circuit arrangements operating with high power dissipation densities and at superimposed high voltage potential so as to remove the resulting heat in order to protect the components against destruction due to overheating. For this purpose, the components or a complete circuit arrangement may be embedded, for example, completely into potting material. The drawback of this, however, is the poor heat conductivity of conventional potting materials so that the power density is limited. Moreover, the formation of cracks in the potting material may lead to accelerating deterioration via loss of heat conduction and corona events and ultimatedly to catastrohpic failure of the equipment. Additionally, completely embedded components, because potting materials shrink during curing process or due to temperature changes, are often subject to excessive mechanical stresses.

A second technique for removal of dissipated power is to arrange the components in a closed system in an insulating oil or to subject them to gas cooling. This requires elaborate and often heavy housing structures and special filling procedures.

SUMMARY OF THE INVENTION

It is an object of the present invention to provide a mounting arrangement of the above-described type which includes a small, homogeneous thickness for a major insulation portion which facilitates heat removal and at the same time makes it possible to minimize, according to the Griffith criterion, the danger of crack formation.

The above and other objects are achieved, according to the invention, in an arrangement for mounting circuit components which operate with high power dissipation densities and at high potential levels, which arrangement includes means a mass of insulating material on which the components are mounted, by the provision of a metal shield embedded in the insulating material and formed to partly surround the components, the mass of insulating material being formed, and the shield being located therein, so that a first, or minor, insulating material portion of uniform thickness is located between the components and a second, or major, insulating material portion of uniform thickness at the side of the shield which faces away from the components and conductor means connected for applying to the metal shield a. potential selected to minimize the potential between the components and the shield, wherein the shield and insulating material portions are formed for enabling the shield to receive power dissipated by the components at high heat flux density and for causing heat received by the shield to be dissipated through the major insulating material portion with low heat flux density.

One advantage of the invention—in addition to the relatively low mechanical stresses in the major insulating material portion, since it is subject to practically no enforced change in volume—is the achievement, in a manner favourable to weight and cost, of very high electronic packing densities for the components employed in spite of the existing high voltage. Another advantage is its flexible adaptation to the most varied circuit designs, high reliability even under changing temperatures and easily effected adaptation to e.g., maximum allowed field intensities and minimum creepage paths specified by a customer.

DESCRIPTION OF THE PREFERRED EMBODIMENTS

Figure 1:
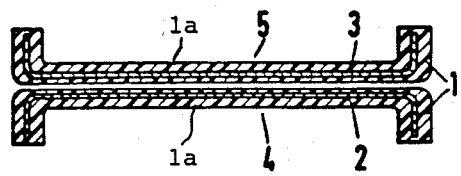
FIG. 1 is a cross-sectional view of one embodiment of two metal shields embedded in plastic.

The device shown in FIG. 1 includes two metal shields 2 and 3 which are each embedded in a plastic mass having a major insulating material portion 1 and a minor insulating material portion 1a. Each shield is composed, for example, of a square, trough-shaped metal. By means of suitable contacts, these metal shields 2 and 3 may be held at a given potential. The regions defined by the trough-shaped metals are intended as installation regions 4 and 5 for the electrical and/or electronic components.

Figure 2:
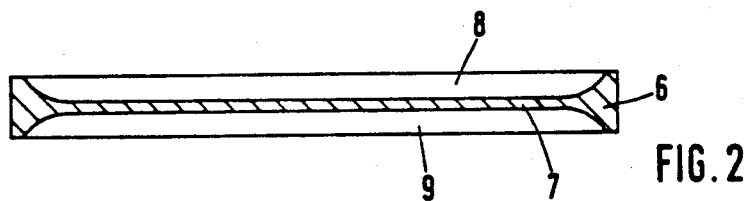
FIG. 2 is a cross-sectional view of a special embodiment of a counterelectrode for the metal shield which accomodates the components.

One embodiment of a counterelectrode for the metal shields is shown in FIG. 2 where the counterelectrode is formed by a square frame 6 having a metal plate 7 which is arranged in the center between the side walls defining frame 6. In this case, the two regions 8 and 9 formed by the side walls and the metal plate 7 can be used as the installation regions for the components.

Figure 3:
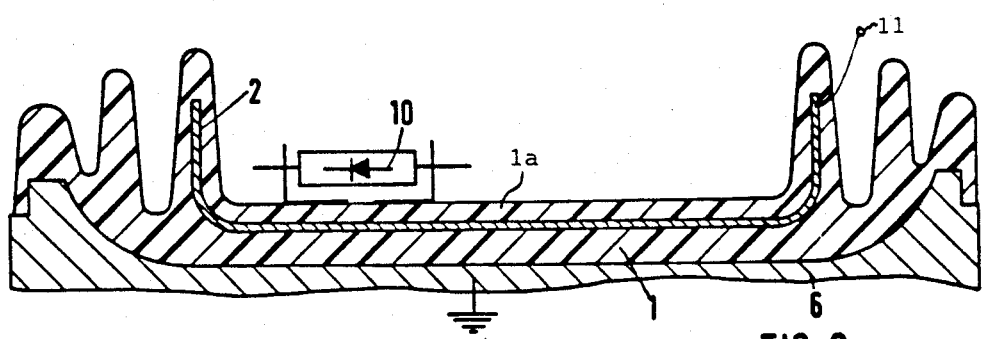
FIG. 3 is a cross-sectional view of a complete arrangement according to the invention for accommodating components.

In the arrangement shown in FIG. 3, a metal shield 2 as shown in FIG. 1 is embedded between the major insulating material portion 1 mounted on the counterelectrode 6 and the minor insulating material portion 1a. The counterelectrode 6 is connected, for example, to ground potential. The metal shield 2 serves to accommodate electrical and/or electronic components of which a single diode 10 is shown in the drawings as an example.

Usually the power dissipation in electrical or electronic components or electronic circuit arrangements occurs only in spatially well defined regions, e.g. in the barrier layer of the diode 10. If simultaneously the voltages occurring in a circuit region are comparable to or less than a potential superposed over this region, it is of advantage to confine this area by the metal shield 2. This metal shield receives the power loss with locally high heat flux densities. Due to the fact that the metal shield is placed at a suitable superposed potential applied via a conductor 11 connected to shield 2, i.e. the voltage between component 10 and metal shield 2 is minimized, consequently the minor insulating material portion 1a can be kept thin enough to keep the temperature differences between component and shield small. Within the metal shield the heat distributes uniformly and can be removed through the major insulating material portion 1 with low heat flux density. It is possible to shape the metal shield in such a way that the electrical stress does not exceed the average stress anywhere in portion 1. This is easily achieved by shaping the shield to a Rogowski (W. Rogowski, Archiv für Elektrotechnik, Vol. 12, pp. 1–15, 1923,) profile.

Typical overall dimensions of the unit are 1 to several inches. Thickness of the major insulating material portion 1 is of the order of tenths of an inch, the thickness of the minor insulating material portion 1a is a fraction thereof. The device may be applied for handling voltages of several kilovolts to several tens of kilovolts across the major insulating material portion 1. The minor insulating material portion 1a may be designed to handle only logic level type voltages (e.g. 5 V) in one application or it may be designed to handle kilovolt signals of a power electronics circuit in another application.

It will be understood that the above description of the present invention is susceptible to various modifications, changes and adaptations, and the same are intended to be comprehended within the meaning and range of equivalents of the appended claims.

What is claimed is:

1. An arrangement comprising: at least one circuit component which operates with high power densities at high potential levels; a mass of insulating material which includes a major insulating material portion and a minor insulating material portion, each said portion having a uniform thickness, with said at least one component being directly mounted on said minor portion and in heat-conductive communication with said minor portion; a metal shield embedded between said insulating material portions, electrically insulated from said component by said minor portion and formed to partly surround the region occupied by said at least one component; and electrical conductor means connected to said metal shield for applying thereto an electrical potential selected to minimize the potential between said at least one component and said shield across said minor portion, wherein said shield and said insulating material portions are formed for enabling said shield to receive power dissipated by said at least one component through said minor portion at high heat flux density and for causing heat received by said shield to be removed through said major portion with low heat flux density.

2. An arrangement as defined in claim 1 wherein said minor portion is thinner than said major portion.

3. Arrangement as defined in claim 1 wherein said metal shield is constructed to prevent an excess increase in electrical and mechanical stresses.

4. Arrangement as defined in claim 1 or 2 wherein said metal shield is composed of a trough-shaped metal container whose interior is shielded by said major portion against ground potential.

* * * * *